United States Patent [19]

Preslar

[11] 4,357,548
[45] Nov. 2, 1982

[54] CIRCUIT ARRANGEMENT USING EMITTER COUPLED LOGIC AND INTEGRATED INJECTION LOGIC

[75] Inventor: Donald R. Preslar, Plainfield, N.J.

[73] Assignee: RCA Corporation, New York, N.Y.

[21] Appl. No.: 155,998

[22] Filed: May 30, 1980

[51] Int. Cl.³ .............. H03K 19/092; H03K 19/086; H03K 19/091

[52] U.S. Cl. ................................ 307/475; 307/455; 307/459

[58] Field of Search ............... 307/475, 455, 459, 467, 307/477; 357/92

[56] References Cited

U.S. PATENT DOCUMENTS

| | | | |
|---|---|---|---|
| 4,007,385 | 2/1977 | Chapron | 307/296 |
| 4,013,901 | 3/1977 | Williams | 307/477 X |
| 4,132,059 | 1/1979 | Williams | 307/477 X |
| 4,158,782 | 6/1979 | Price, Jr. | 307/475 |
| 4,189,909 | 2/1980 | Marum | 357/92 X |
| 4,256,984 | 3/1981 | Kojima | 307/475 |
| 4,326,135 | 4/1982 | Jarrett et al. | |

FOREIGN PATENT DOCUMENTS 2014387 of 0000 United Kingdom .

OTHER PUBLICATIONS

S. Hilliker, "A Uniquely Simplified TV Tuning System Incorporating an Equally Unique Digital Automatic and Manual Fine Tuning Scheme", IEEE Transactions on Consumer Electronics, Feb. 1976, pp. 61–68.

Primary Examiner—John Zazworsky
Attorney, Agent, or Firm—E. M. Whitacre; P. J. Rasmussen; P. M. Emanuel

[57] ABSTRACT

In a circuit using integrated injection logic and emitter coupled logic circuits, a unique arrangement is used to facilitate the interface between various circuit sections. An embodiment in an AM/FM digital tuner circuit is shown. Specifically, the integrated injection logic circuits are stacked with the current supply for the integrated injection logic stack being directly connected to the same power supply operating potential as the current supply for the emitter coupled logic circuits. Such arrangement reduces the magnitude of the potential difference between logic signal voltage levels between the respective logic circuits. Representative interface circuits between integrated injection logic circuits and emitter coupled logic circuits are disclosed. An interface circuit using emitter coupled logic is disclosed for fast level shift between upper and lower level circuits within the integrated injection logic stack.

7 Claims, 7 Drawing Figures

CIRCUIT ARRANGEMENT USING EMITTER COUPLED LOGIC AND INTEGRATED INJECTION LOGIC

FIELD OF THE INVENTION

This invention relates to circuit arrangements for interfacing emitter coupled logic and integrated injection logic circuits.

Integrated injection logic ($I^2L$) circuits provide high-packing density and low power consumption. A basic $I^2L$ inverter comprises a lateral injector transistor connected to provide an injector current across the base-emitter junction of a vertical switching transistor. The inverter is switched between logic levels by either permitting the injector current to flow through the base-emitter junction of the switching transistor, or shunting the injector current to the emitter electrode of the switching transistor.

A typical $I^2L$ circuit requires an approximate operating potential difference of only 0.7 volts at a substantially constant current. So, it is customary to stack $I^2L$ logic circuits into a plurality of ranks which are serially connected to receive a much larger operating potential (e.g. 5.0 volts) with which other types of logic used with the $I^2L$ logic are powered. This avoids the need for supplying two different operating potentials, one for each type of logic to be powered.

A resistor or a regulated current supply is provided to inject a substantially constant current into the current injectors at the top rank of the stack. The current passing through one rank is used to operate the injector transistors and switching transistors on the next level.

Emitter coupled logic (ECL) circuits, using non-saturated current mode logic, provide high speed operation, as compared to that achievable with present day $I^2L$ circuits. A typical ECL inverter comprises a constant current source directly connected to a first power supply operating potential, first and second transistors connected as an emitter coupled differential amplifier for switching the current provided by the constant current source, and respective loads connected from each respective collector of said first and second transistor to a second power supply operating potential. An ECL input signal is coupled to the base electrode of the first transistor. The base electrode of the second transistor may be connected to the complement of the ECL input signal or to a reference potential set approximately at the average level between the ECL logic levels corresponding to logic 0 and the logic 1. The output signal is provided at the collector electrode of either the first or second transistor, or may be buffered by a third transistor arranged as an emitter follower amplifier for supplying the ECL output signal at lower source impedance for adequate "fan out" to a greater number of succeeding ECL logic gates. The base electrode of the third transistor is connected to the collector electrode of either the first transistor or the second transistor depending upon whether an inverted or non-inverted output signal is desired.

In certain applications, which require both relatively high speed and relatively low speed digital signal processing in the same system, it is advantageous to combine $I^2L$ and ECL circuits. The ECL logic provides the relatively fast switching speed, while the lower speed $I^2L$ logic provides high density, lower power logic capability at slower switching speed.

An example of such advantageous combination of ECL and $I^2L$ is a digital frequency synthesizer used for controlling the tunable local oscillator in radio and television receivers. ECL circuitry is used where high speed is desirable, such as for a prescaler for frequency division of the high frequency signal produced by the receiver local oscillator. $I^2L$ circuitry is used to reduce power consumption and increase circuit density where high speed is not of particular concern such as for divider stages following the prescaler or for the control logic.

Using ECL and $I^2L$ together, however, requires that various level shift circuits be provided to interface the two logic circuit forms. As a specific example, assume that the system power supply provides first and second operating potentials of $-5.0$ volts and 0 volts respectively, that the current sources supplying the ECL circuits are connected to the $-5.0$ volts power supply terminal, and that the current sources supplying the $I^2L$ circuits are directly connected to the 0 volt power supply terminal. Under such conditions, ECL signal levels are approximately $-0.8$ and $-1.6$ volts, corresponding to logic 1 and logic 0 respectively, while corresponding $I^2L$ signal levels are approximately $-4.3$ and $-5.0$ volts respectively. Therefore, a signal translation of approximately 3.5 volts is required, both in the upward and downward directions.

SUMMARY OF THE INVENTION

The present invention is embodied in ECL and $I^2L$ circuit arrangements for reducing the logic signal level difference between ECL and $I^2L$ circuits, thereby permitting simpler, faster interface circuits for translating logic signals from one logic circuit form to another.

In accordance with one aspect of the present invention, particular current sources are relocated so as to reduce the potential difference between ECL and $I^2L$ signal levels. In particular, where ECL and $I^2L$ circuits are operated between first and second operating potentials, and $I^2L$ circuits may be stacked in a plurality of ranks, either the current sources associated with the $I^2L$ circuits or the current sources associated with the ECL circuits are relocated so that all such current sources are connected to same operating potential. In the embodiment shown, the respective current sources associated with the ECL and $I^2L$ circuits are both connected to the first operating potential, and the load devices of the ECL circuits and the injector transistors of the $I^2L$ circuits are both connected to the second operating potential. The present arrangement reduces the potential difference between respective logic levels of the ECL circuits and the $I^2L$ circuits.

Further aspects of the present invention then concern specific embodiments of interface circuits provided for translating logic signals from an ECL output to an $I^2L$ input, and for translating an $I^2L$ output to an ECL input.

A still further aspect of the present invention is embodied in an interface circuit for translating between an upper rank $I^2L$ output and a lower rank $I^2L$ input, which interface circuit uses an ECL circuit for fast logic level shift.

DETAILED DESCRIPTION

Figure 1:
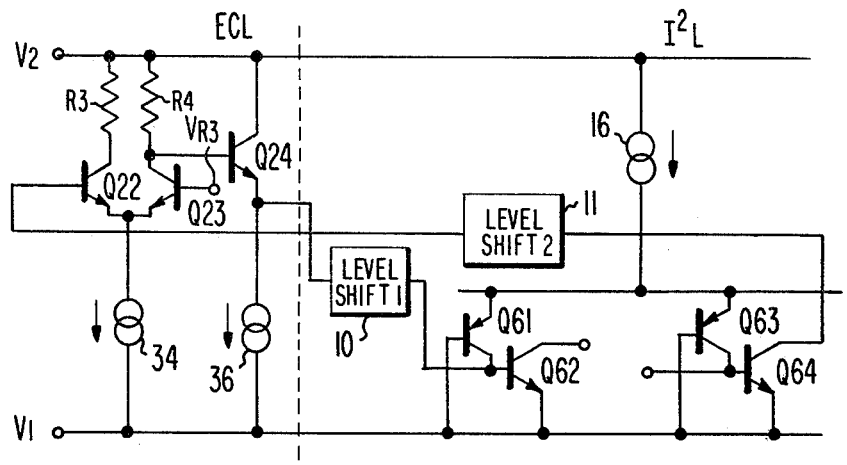
FIG. 1 is an ECL and $I^2L$ combination as known in the prior art.

A known circuit arrangement combining ECL and I²L circuits is shown in FIG. 1. A typical ECL logic circuit comprises a pair of emitter coupled transistors Q22, Q23, current source 34, load resistors R3, R4, and an emitter follower stage comprising transistor Q24 and current source 36. The base electrode of transistor Q22 receives an ECL logic signal, while the base electrode of transistor Q23 is connected to a source of bias potential $V_{R3}$ set between the ECL voltage levels corresponding to logic 0 and logic 1. Load resistors R3 and R4 are each chosen to provide about 0.8 volt drop thereacross when conducting the current from source 34. Assuming that terminals V1 and V2 are respectively connected to operating potentials of 5.0 volts and 0 volts respectively and that the forward biased base-emitter voltage ($V_{BE}$) of the ECL transistor Q24 is 0.8 volts, then the ECL logic levels at the emitter electrode of transistor Q24 are $-0.8$ and $-1.6$ volts corresponding to logic 1 and logic 0 respectively.

A typical I²L logic circuit also shown in FIG. 1 comprises a current source 16 and an injector transistor Q63 arranged to provide a substantially constant current to the base electrode of a switching transistor Q64. When the base electrode of Q64 is shunted to the emitter electrode thereof (via a logic signal source not shown), the current from injector transistor Q63 is shunted away from transistor Q64, which provides a high impedance output at the collector electrode of transistor Q64. When the base electrode of transistor Q64 is not shunted, the current from transistor Q63 is injected through the base-emitter junction of transistor Q64, providing a low impedance output at the collector electrode of transistor Q64. Assuming the $V_{BE}$ of the injector transistor Q63 is estimated as 0.7 volts, then the I²L logic levels are approximately $-4.3$ and $-5.0$ volts corresponding to logic 1 and logic 0 respectively. This is so because for switching transistor Q64 to be switched between non-conducting and conducting states, its base voltage must be increased by approximately 1 $V_{BE}$ (about 0.7 volts) with respect to its emitter voltage which is the V1 potential of $-5$ volts. Transistors Q61 and Q62 are arranged in a similar fashion to the I²L gate comprising Q63 and Q64.

Thus, a level shift circuit 10 between the output of the ECL arrangement of the emitter electrode of Q24 and the input of the I²L circuit comprising Q61 and Q62 must provide a signal translation of about $-3.5$ volts. Similarly, level shift circuit 11 must provide a signal translation from an I²L gate Q63, Q64 output to an ECL gate input Q22 of about $+3.5$ volts.

The prior art circuit arrangement shown in FIG. 1 includes a current source 16 connected between terminal V2 and the highest rank I²L circuit. Compare the prior art arrangement of FIG. 1 to the present arrangement shown in FIG. 2 wherein there are a plurality of I²L circuits arranged in series in ranks or stacked between supply terminals V2 and V1 with the highest rank I²L circuits Q52, Q53 Q54, Q55 connected to terminal V2 and the current source 26 is relocated to a position between terminal V1 and the lowest rank I²L circuits including Q56, Q57 and Q58, Q59. The relocation of such current source shifts the I²L signal levels of the upper I²L rank towards the ECL signal levels thereby facilitating the I²L/ECL interface. Specifically, the respective ECL logic levels are $-0.8$ and $-1.6$ volts as before, but the I²L logic levels for the highest rank I²L circuits Q52, Q53 and Q54 and Q55 are now 0 volts and $-0.7$ volts. This is so because for switching transistors Q53 and Q55 to be switched between non-conducting and conducting states, their base voltages must be increased by approximately 1 $V_{BE}$ (about 0.7 volts) with respect to their emitter voltages which are at the V1 potential of 0 volts. Thus, the present arrangement provides respective ECL and I²L logic signal levels which differ by about 0.7 volts, i.e. about one $V_{BE}$ of a semiconductor junction. This is to be compared to the prior art arrangement wherein the ECL and I²L logic signal levels differ by about 3.5 volts.

Level shift circuit 12 translates a signal from an ECL output Q24 to an upper rank I²L gate Q52, Q53. Level shift circuit 13 translates a signal from an upper rank I²L gate Q54, Q55 to an ECL input Q22. Level shift circuit 14 translates a signal from an upper rank I²L gate Q54, Q55 to a lower rank I²L gate Q56, Q57. Level shift circuit 15 translates a signal from a lower rank I²L gate Q58, Q59 to an upper rank I²L gate Q54, Q55. Specific circuit embodiments of level shift circuits 12, 13, 14 and 15 are illustrated in FIGS. 3, 4, 5, and 6 respectively.

Figure 2:
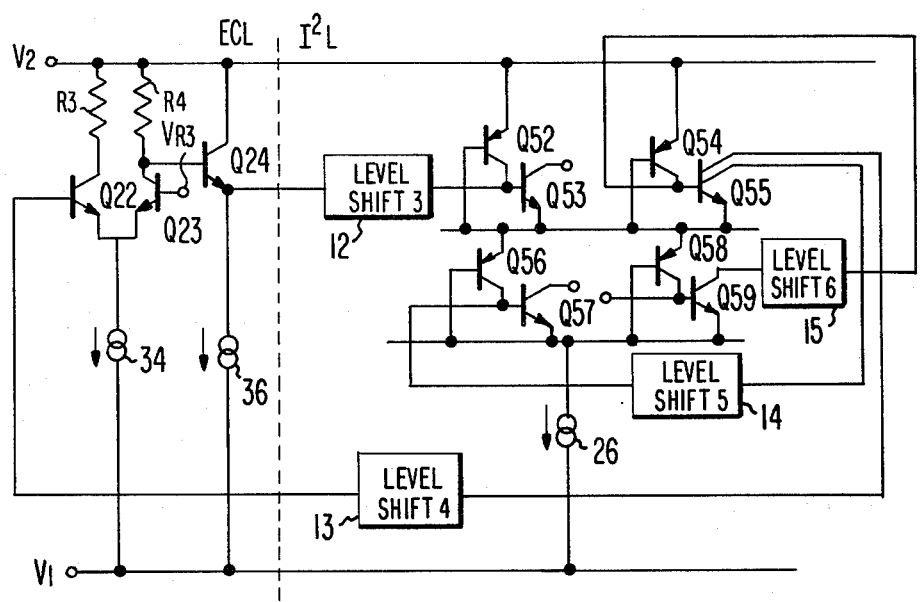
FIG. 2 is an ECL and $I^2L$ circuit arrangement embodying the present invention.
Figure 3:
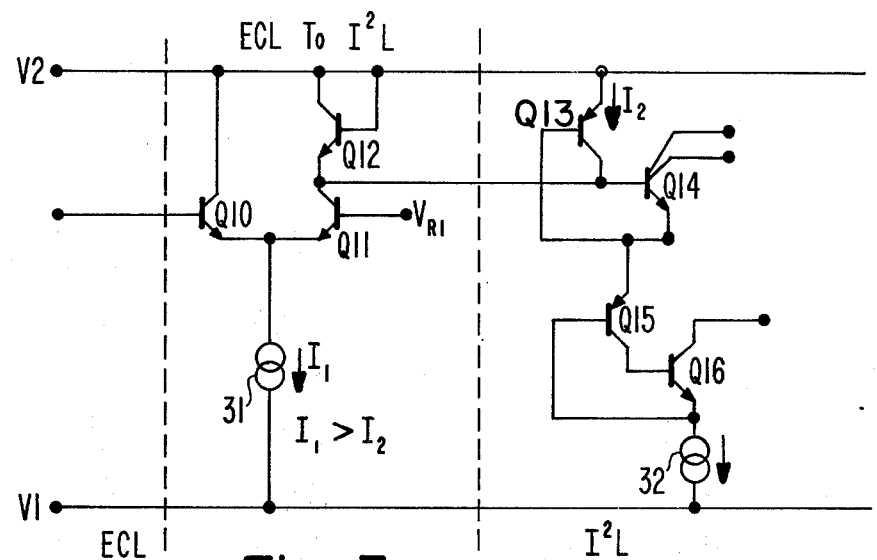
FIG. 3 is an ECL to I²L interface circuit embodying the present invention.

FIG. 3 shows an interface circuit for level shifting a logic signal from an ECL circuit (not shown) to an upper rank I²L circuit Q13, Q14 and as such may be used as level shift circuit 12 of FIG. 2 (which has therefore been labeled "level shift 3"). The upper rank I²L circuit Q13, Q14 and a lower rank I²L circuit Q16 are connected in series with a current source 32 between terminals V2 and V1. It will be understood that the term current source herein refers to a constant current generator providing a substantially constant current output which does not vary significantly with supply voltage. Current source 32 may be a fixed resistor, or a transistor device having a bias potential applied at its base electrode for conditioning it to conduct a constant output current. Other current source arrangements as are known to those skilled in the art are also suitable.

The level shift circuit of FIG. 3 comprises an emitter coupled differential amplifier Q10, Q11, a current source 31, and a diode-connected transistor Q12. The base electrode of Q10 receives the ECL input signal, while the base electrode of Q11 is connected to a source of bias potential $V_{R1}$, set to $-1.2$ volts which is between the voltages of $-0.8$ and $-1.6$ volts corresponding to the 0 and 1 ECL logic levels. Alternatively, the base electrode of transistor Q11 may be connected to the logical complement of the ECL input signal.

In operation, when the base electrode of transistor Q10 is $-0.8$ volts, then transistor Q10 is on and Q11 is off. The output signal at the collector electrode of transistor Q11 is near 0 volts, i.e., the 1 logic level for upper rank I²L circuit Q13, Q14, due to the pull-up action of conductive injector transistor Q13. When the base electrode of transistor Q10 is −1.6 volts, transistor Q10 is off and Q11 is on and diode-connected transistor 12 is forward biased into conduction. The voltage drop across Q12 provides an output signal of about −0.8 volts, i.e., the 0 logic level for the upper rank I²L circuit Q13, Q14, at the collector electrode of transistor Q11. Current $I_2$ is shunted away from transistor Q14 due to the conduction of Q11.

Diode-connected transistor Q12 tends to prevent transistor Q11 from going too deeply into its saturation region of operation, which would otherwise slow down the switching speed of the interface circuit. Desirably, current $I_1$ from source 31 is greater than $I_2$ from source Q13 in order to insure that all the injector current $I_2$ is shunted away from transistor Q14. For this purpose, e.g., current $I_1$ is desirably set at two or three times $I_2$ to turn off transistor Q14 faster.

Figure 4:
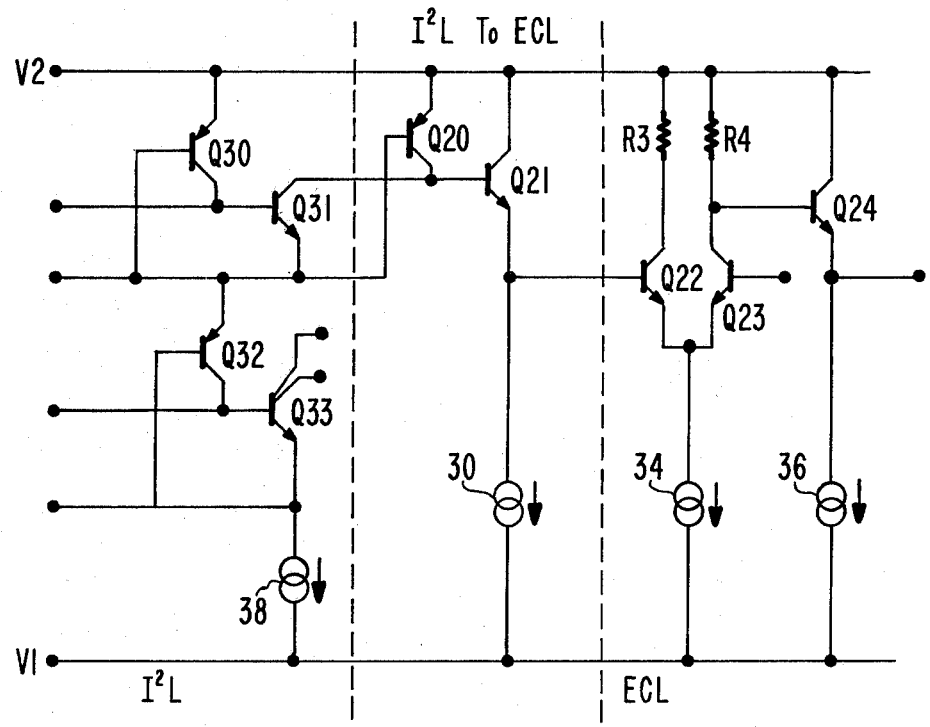
FIG. 4 is an I²L to ECL interface circuit embodying the present invention.

FIG. 4 shows an interface circuit for level shifting a logic signal from an upper rank I²L circuit Q30, Q31 to an ECL circuit Q22, Q23, R3, R4, 34, Q24, 36 and as such may be used as level shift circuit 13 of FIG. 2, (which has therefore been labeled "level shift 4"). The upper rank I²L circuit Q30, Q31 is shown stacked in series with a lower rank I²L circuit Q32, Q33 and a current source 38. In the interface circuit, an injector transistor Q20 acts as an active pull-up transistor for the collector output of transistor Q31.

The level shift circuit of FIG. 4 also comprises transistor Q21 and current source 30 which are arranged as an emitter follower amplifier, the output thereof being one $V_{BE}$ (of transistor Q21) offset from the input thereof. When switching transistor Q31 is non-conductive so that the base electrode of transistor Q21 is near 0 volts due to the pull-up action of injector transistor Q20, the emitter electrode is at about −0.8 volts, i.e., the ECL 0 logic level. When switching transistor 31 is conductive so that the base electrode is near −0.7 volts, the emitter electrode is at about −1.5 volts, i.e., the ECL 1 logic level.

Figure 5:
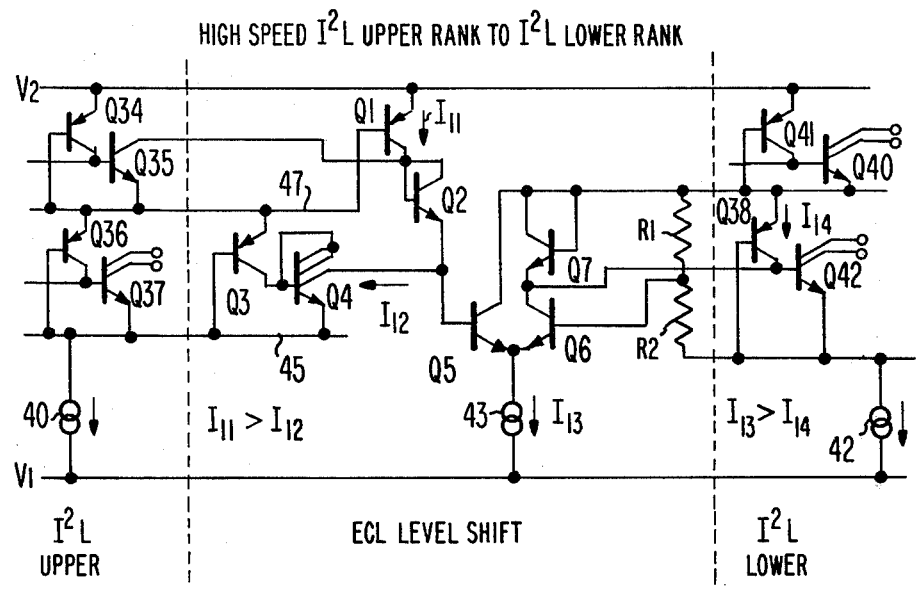
FIG. 5 illustrates an interface circuit using ECL circuitry to translate an I²L upper rank output to an I²L lower rank input in accordance with an aspect of the present invention.

FIG. 5 shows an interface circuit for level shifting a logic signal from an upper rank I²L logic circuit to a lower rank I²L logic circuit and as such may be used as level shift circuit 14 of FIG. 2 (which has therefore been labeled "level shift 5"). An ECL circuit is used to provide high speed upper rank I²L to lower rank I²L level shifting. The upper rank I²L logic circuit Q34, Q35 is stacked in series with a lower rank I²L gate Q36, Q37 and a current source 40. Another lower rank I²L logic circuit Q38, Q42 is stacked in series with another upper rak I²L circuit Q41, Q40 and a current source 42. The ECL level shift circuit translates between the upper rank I²L circuit Q34 and the lower rank I²L circuit Q38, Q42.

The level shift interface in FIG. 5 includes an emitter coupled differential amplifier Q5, Q6, current source 43, diode-connected transistor Q7, and an input network including transistors Q1, Q2, Q3, and Q4. The base electrode of transistor Q6 is connected to a source of bias potential set to −1.1 volts which is between −0.7 and −1.4 corresponding to the I²L 1 and 0 logic levels for lower rank I² L circuit Q38, Q42 since the emitters of the lower rank are at 2 $V_{BE}$ (−1.4 volts) below the V2 potential of 0 volts. Resistors R1, R2 form a voltage divider network for providing such bias potential to transistor Q6.

The base electrode of transistor Q5 is connected to the input network Q1, Q2, Q3, Q4 which substracts about 0.7 volts ($V_{BE}$) *from the upper rank I²L* logic signal. Transistor Q1 and transistors Q3 and Q4 are arranged as current sources for providing currents $I_{11}$ and $I_{12}$ respectively. In the Q3, Q4 current source, transistor Q3 conditions transistor Q4, which is arranged as a current mirror amplifier as shown with two of its three collectors connected to its base and the other collector supplying current $I_{12}$, for conduction. Transistor Q2 is connected as a diode and poled for forward conduction through transistors Q1 and Q4.

In operation, when transistor Q35 is non-conductive, its collector electrode is near 0 volts due to conduction of transistor Q1. The potential at the base electrode of transistor Q5 is the potential V2 (also due to conduction of transistor Q1) offset by the $V_{BE}$ of transistor Q2 of approximately −0.8 volts. Since the base electrode of transistor Q6 is biased at −1.1 volts, Q5 is on and Q6 is off. The output signal at the collector electrode of transistor Q6 is at approximately −0.7 volts due to the conduction of transistor 38 which pulls-up the voltage at the collector of transistor Q6 toward the voltage at the emitters of the switching transistors, e.g., such as Q40, of the upper I²L rank. When transistor Q35 is conductive, the voltage at its collector electrode is near the voltage at its emitter electrode, i.e., −0.7 volts. Now, a portion of the current $I_{11}$ flows through transistor Q35. The base electrode of transistor Q5 goes to about −1.4 volts (the lower power supply rail 45 potential on the lower I²L rank) because of the 1 $V_{BE}$ (0.7 volts) drop across diode connected transistor Q2 which is conductive due to the conduction of transistors Q1 and Q4. As a result, transistor Q5 is off and Q6 is on and diode-connected transistor Q7 is forward biased into conduction. Current $I_{14}$ is shunted away from transistor Q42 due to the conduction of Q6.

Diode-connected transistor Q7 tends to prevent transistor Q6 from going too deeply into its saturation region of operation. Current $I_{13}$ from source 43 is at least greater than current $I_{14}$ from source Q38. Desirably, $I_{13}$ is two to three times $I_{14}$ in order to rapidly turn off transistor Q42. The current $I_{11}$ from current source Q1 should be sufficiently greater than that of current source Q4 in order to provide base current drive for transistor Q5.

Figure 6:
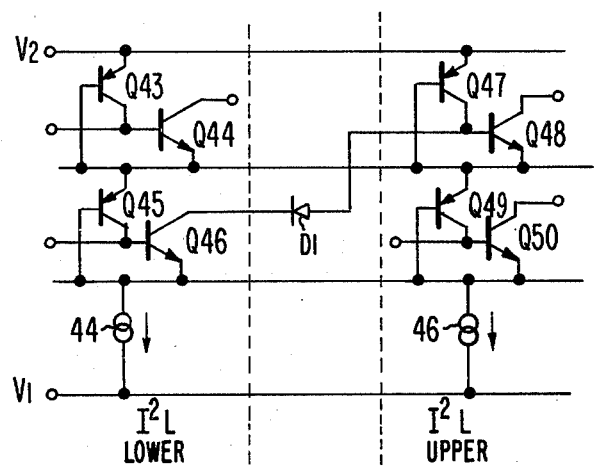
FIG. 6 shows a known interface circuit technique for level shifting an I²L lower rank output to an I²L upper rank input.

A circuit for level shifting a logic signal from a lower rank I²L circuit to a higher rank I²L circuit is shown in FIG. 6 which, as such may be used as level shift circuit 15 of FIG. 2 (which has been therefore labeled "level shift 6"). The lower rank I²L circuit Q45, Q46 is in series with an upper rank I²L circuit Q43, Q44 and a current source 44 between the V2 and V1 supply terminals. The upper rank I²L circuit Q47, Q48 is in series with a lower rank I²L circuit Q49, Q50 and a current source 46 between the V2 and V1 supply terminals. Since the emitter of switching transistor Q46 of the lower rank I²L circuit is 1 $V_{BE}$ below the emitter of switching transistor Q48 of the lower rank I²L cituit, diode D1 is connected between the collector of transistor Q46 and the base of transistor Q48 to provide a 1 $V_{BE}$ voltage drop so that the base electrode of transistor Q48 is not switched through a large potential difference.

In the specific application of the present invention which is described in detail below, all interface signal level shifting occurs between ECL circuits to and from the top I²L rank or between the top I²L rank to and from the lower I²L rank. In order to interface between ECL circuits to or from lower rank I²L circuits, the signal is routed through the top rank I²L circuits. However, it should be noted that one can interface between the lower rank I²L circuits to or from the ECL circuits directly.

Figure 7:
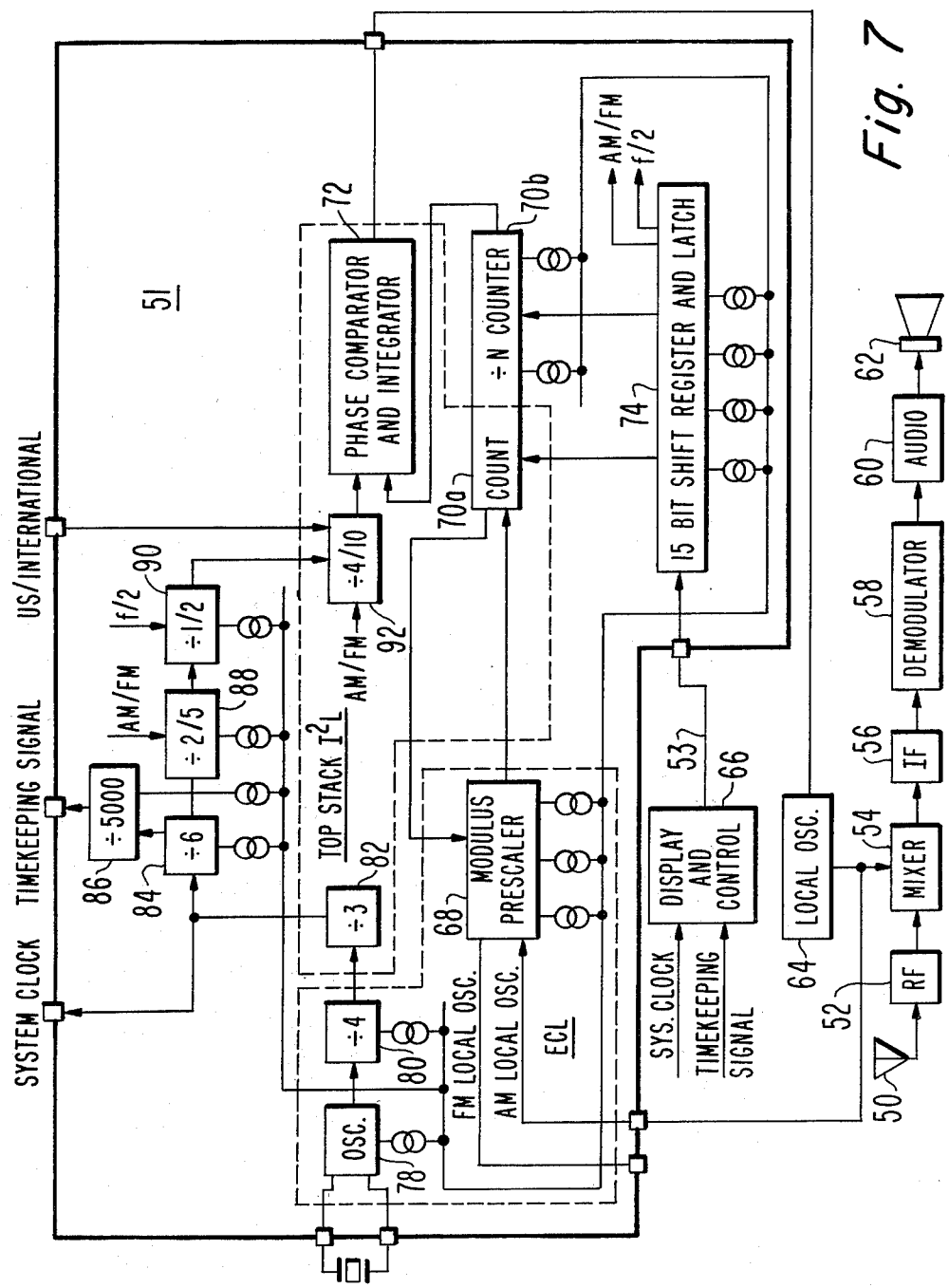
FIG. 7 is a block diagram illustrating an application of the present invention in a radio frequency tuner apparatus using a phase locked loop for controlling the tunable local oscillator of an AM radio receiver.

FIG. 7 illustrates an application of the present invention used in a radio frequency tuner apparatus for controlling the tunable local oscillator in an AM/FM radio receiver. The receiver comprises an antenna 50, an RF amplifier 52, a voltage controlled local oscillator 64, a mixer 54, an IF amplifier 56, a demodulator 58, an audio amplifier 60, and a speaker 62. The local oscillator 64 and a tuner control integrated circuit (IC) 51 form a phase locked loop (PLL) which maintains the local oscillator output signal at a frequency selected by the user through a control and display apparatus 66. Station frequency information is transfered to the 15 bit shift register and latch 74 from the control and display apparatus 66 via a data bus 53.

The tuner control IC 51 uses both ECL and I²L circuits. The ECL circuitry is used in a dual modulus prescaler 68, a crystal oscillator 78, and a first frequency divider 80. The remainder of the IC 51 is embodied in I²L circuitry. As shown by dashed lines in FIG. 7, the top I²L rank is used for a portion 70a of a divide by N counter, a phase comparator and integrator 72, and a frequency divider stage 92.

The lower I²L rank is used for the remaining portion 70b of the divide by N counter, the remaining frequency divider stages 84, 86, 88, 90 and the input shift register and data latch 74. Appropriate interface circuits are used at those points where connections are indicated between the various ECL, upper rank I²L and lowe rank I²L circuits.

The operation of a PLL and the use of a dual modulus prescaler shown in FIG. 7 are well known to those skilled in the art. For a description of such techniques applied to a television tuning system, see the article by Steve Hilliker published in *IEEE Transactions on Consumer Electronics,* February, 1976, pages 61 through 68.

Other functions provided by IC 51 include generation of a system clock at the output of frequency divider 82 for use by the system control and display apparatus 66, control portion of which may be a programmed microprocessor. Also provided is a timekeeping signal at the output of divider 86 used for timekeeping functions such as a continuously running digital clock. Programmable dividers 88, 90 and 92 provide AM/FM mode selection, PLL loop frequency selection, and United States or international channel spacing selection, respectively. One skilled in the art will be able to readily select the appropriate crystal frequency 76 and the selectable ratio of divider 80, 82, 84, 88, 90, 92 to obtain the necessary reference frequency output from divider 92 so that the PLL will oscillate at the appropriate frequency.

It should be realized that the use of the present invention in a radio frequency tuner apparatus is not limited to radio receivers but applies equally well to other tunable radio frequency apparatus. Furthermore, the circuit arrangement of the present invention is applicable wherever it is desirable to combine ECL circuits for high speed and I²L circuits for high density or low power. For example, in a digital telecommunications receiver application where a digital message is time multiplexed at high speed in a wide band transmission medium, it is advantageous to use ECL circuitry in the front end to process the received high speed signals, and I²L circuitry elsewhere to perform low speed control functions after the message is received.

What is claimed is:
1. A circuit arrangement comprising:
   first and second terminals for receiving an operating potential therebetween;
   an ECL circuit including first current source means for providing a first current directly connected to said first terminal, first and second transistors connected as an emitter coupled differential amplifier for switching said first current through one of the collector-emitter paths of said first and second transistors, the base electrodes of said first and second transistors being arranged for receiving a differential input potential corresponding to an ECL signal, load means connected between the collector electrode of said first transistor and said second terminal, means for connecting the collector electrode of said second transistor to said second terminal, and means connected to the collector electrode of said first transistor for providing an ECL signal;
   an I²L circuit including second current means for providing a second current directly connected to said first terminal, a switching transistor, and an injector transistor of opposite conductivity type to said switching transistor, the emitter electrode of said injector transistor being connected to said second terminal, the collector electrode of said injector transistor being connected to the base electrode of said switching transistor and being arranged to receive an input potential corresponding to an I²L signal, the base electrode of said injector transistor being connected to said second current source, the collector of said switching transistor providing an I²L signal; and
   interface means for coupling signals between said ECL circuit and said I²L circuit including an interface circuit for translating ECL signal levels to I²L signal levels, said interface circuit including third current source means for providing a third current directly connected to said first terminal, third and fourth transistors being connected as an emitter coupled differential amplifier for switching the current provided by said third current source through one of the collector-emitter paths of said third and fourth transistors, the base electrode of one of said third and fourth transistors being connected to the collector electrode of said first transistor of said ECL circuit, the collector electrodes of said third and fourth transistors connected to said second terminal, the collector electrode of one of said third and fourth transistors being connected to the base electrode of said switching transistor of said I²L circuit.

2. A circuit arrangement according to claim 1 wherein said interface circuit for translating ECL signal levels to I²L signal levels includes:
   diode means connecting the collector electrode of said one of said third and fourth transistors which is connected to the base electrode of said switching transistor to said second terminal, said diode means being poled for conducting said third current.

3. A circuit arrangement according to claim 1 further including a second I²L circuit including a second switching transistor, and a second injector transistor of opposite conductivity type to said second switching transistor, the emitter electrode of said second injector transistor being connected to said second terminal, the collector electrode of said second injector transistor being connected to the base electrode of said second switching transistor and being arranged to receive an input potential corresponding to an I²L signal, the base electrode of said second injector transistor and the emitter electrode of said second switching transistor being connected to said second current source, the collector of said second switching transistor providing an I²L signal, wherein said interface means for coupling signals between said ECL circuit and said I²L circuit further includes a second interface circuit for translating I²L signal levels to ECL signal levels, said second interface circuit including:

an input terminal at which said I²L signal levels are developed connected to the collector electrode of said second switching transistor of said second I²L circuit, an output terminal at which said ECL signal levels are developed; and means for introducing a voltage difference between said input and output terminals substantially equal to the voltage drop of a semiconductor junction.

4. A circuit arrangement according to claim 3 wherein said means for introducing a voltage difference between said input and output terminals includes an emitter follower amplifier, said emitter follower amplifier comprising:

fourth current source means for providing a fourth current connected between said second terminal and said input terminal;

a third transistor connected at the base electrode thereof to said input terminal, at the collector electrode thereof to said second terminal, and at the emitter electrode thereof to said output terminal; and fifth current source means providing a fifth current connected between said output terminal and said first terminal.

5. In an arrangement of I²L circuits wherein said I² L circuits are stacked in a plurality of ranks between first and second terminals including a first upper rank I² L circuit, a first lower rank I² L circuit, and first current source means for providing a first current connected in series in the order named between said second and said first terminals; a second upper rank I²L circuit, a second lower rank I²L circuit, and second current source means for providing a second current connected in series in the order named between said second and said first terminals; and an interface circuit for coupling signals from an output of said first upper rank I²L circuit to an input of said second lower rank I²L circuit comprising:

an input terminal connected to said output of said first upper rank I²L circuit;

an output terminal connected to said input of said second lower rank I²L circuit;

third current source means for providing a third current directly connected to said first terminal;

first and second transistors having respective emitter, base and collector electrodes, the emitter electrodes of said first and second transistors being connected to said third current source means, the collector electrode of said first transistor being connected to a point between said second upper rank I²L circuit and said second lower rank I²L circuit, the collector electrode of said second transistor being connected to said output terminal;

diode means for connecting said point between said second upper rank I²L circuit and said second lower rank I²L circuit to the collector electrode of said second transistor, said diode means being poled to conduct said third current;

means for generating a bias potential at the base electrode of said second transistor, said bias potential being substantially equal to the potential between said point between said second upper rank I²L circuit and said second lower rank I²L circuit and a point between said second lower rank I²L circuit and said second current source means; and means for introducing a voltage difference between said input terminal and the base electrode of said first transistor substantially equal to the forward-biased voltage drop of a semiconductor junction.

6. An interface circuit arrangement according to claim 5 wherein said means for introducing a voltage difference between said input terminal and the base electrode of said first transistor comprises:

fourth current source means for providing a fourth current connected between said second terminal and said input terminal;

fifth current source means for providing a current connected between said base electrode of said first transistor and a point between said first lower rank I²L circuit and said first current source means; and second diode means for connecting said input terminal to the base electrode of said first transistor, said second diode means being poled for conducting said fourth current.

7. In the circuit arrangement according to claim 5, an interface circuit for coupling signals from an output of said first lower rank I²L circuit to an input of said second upper rank I²L circuit comprising:

second means for introducing a voltage difference between said input of said second upper rank I²L circuit and the output of said first lower rank I²L circuit substantially equal to the voltage drop of a forward-biased semiconductor junction.

* * * * *